(12) United States Patent
Jiang

(10) Patent No.: US 9,142,754 B2
(45) Date of Patent: Sep. 22, 2015

(54) ELECTROMECHANICAL POLYMER-BASED LINEAR RESONANT ACTUATOR

(71) Applicant: Strategic Polymer Sciences, Inc., State College, PA (US)

(72) Inventor: Li Jiang, Union City, CA (US)

(73) Assignee: Novasentis, Inc., Burlingame, CA (US)

( * ) Notice: Subject to any disclaimer, the term of this patent is extended or adjusted under 35 U.S.C. 154(b) by 280 days.

(21) Appl. No.: 13/941,298

(22) Filed: Jul. 12, 2013

(65) Prior Publication Data

US 2015/0015116 A1  Jan. 15, 2015

(51) Int. Cl.
  *H01L 41/09*   (2006.01)
  *H01L 41/193*  (2006.01)
  *B06B 1/06*    (2006.01)
  *B06B 1/12*    (2006.01)

(52) U.S. Cl.
  CPC ............ *H01L 41/193* (2013.01); *B06B 1/0688* (2013.01); *B06B 1/12* (2013.01); *H01L 41/0933* (2013.01)

(58) Field of Classification Search
  CPC ............................ H01L 41/193; B06B 1/0688
  USPC ...................................... 310/323.01, 321, 329
  See application file for complete search history.

(56) References Cited

U.S. PATENT DOCUMENTS

| 6,294,859 | B1 * | 9/2001 | Jaenker .......................... 310/328 |
| 6,545,384 | B1 * | 4/2003 | Pelrine et al. ................. 310/309 |
| 7,034,432 | B1 * | 4/2006 | Pelrine et al. ................. 310/309 |
| 2006/0238066 | A1 * | 10/2006 | Pelrine et al. ................. 310/309 |
| 2012/0206248 | A1 * | 8/2012 | Biggs .......................... 340/407.2 |
| 2013/0100046 | A1 * | 4/2013 | Chuang et al. ................ 345/173 |

* cited by examiner

*Primary Examiner* — Derek Rosenau
*Assistant Examiner* — Bryan Gordon
(74) *Attorney, Agent, or Firm* — Edward C. Kwok; Hogan Lovells US LLP

(57) ABSTRACT

A linear resonant actuator includes: (a) an electromechanical polymer (EMP) actuator; (b) a substrate having a first surface and a second surface, the EMP actuator being mounted on the first surface of the substrate; (c) clamping structure provided on two sides of the substrate so as to allow the substrate to vibrate freely between the two sides of the substrate, in response to an electrical stimulation of the EMP actuator; and (d) an inertial mass element having a contact surface for attaching to the substrate at the second surface of the substrate. The inertial mass element may include contact structures provided to attach to the substrate along thin parallel lines. In one embodiment, the inertial mass element may have a "T" shape, or any suitable shape for stability.

17 Claims, 2 Drawing Sheets

ELECTROMECHANICAL POLYMER-BASED LINEAR RESONANT ACTUATOR

BACKGROUND OF THE INVENTION

1. Field of the Invention

The patent invention is related to electro-active polymer (EAP) or electromechanical polymer (EMP)[1] actuators. In particular, the present invention is related to EAP- or EMP-based linear resonant actuators that provide a haptic response, suitable for use in handheld or mobile devices.

[1] Electromechanical polymers (EMPs) refer to polymers that provide a mechanical response in response to a electrical stimulus and vice versa. EMPs are members of a broader class of polymers known as "electroactive (EAP) polymers," which responses to electrical stimuli are not necessarily limited just to mechanical responses.

2. Discussion of the Related Art

Actuators that are light and miniaturized are highly desirable in many mobile applications. A class of actuators, known as linear resonant actuators ("LRAs"), use magnetic fields, electrical currents or both to control an actuator, so as to create a force that imparts motion to an attached mass. The mass may also be attached to a spring, which helps it return to a central quiescent position. Driving the mass in reciprocal motion about the central quiescent position causes a vibration. However, these actuators typically have a very narrow bandwidth, consume significant power and are limited in their applications because of their size. Resonance tuning of such actuators are also relatively difficult to provide.

SUMMARY

According to one embodiment of the present invention, a linear resonant actuator includes: (a) an electromechanical polymer (EMP) actuator; (b) a substrate having a first surface and a second surface, the EMP actuator being mounted on the first surface of the substrate; (c) clamping structure provided on two sides of EMP actuator so as to allow the substrate to vibrate with the EMP actuator, in response to an electrical stimulation of the EMP actuator; and (d) an inertial mass element having a contact surface for attaching to the substrate at the second surface of the substrate. The inertial mass element may include contact structures provided to attach to the substrate along thin parallel lines. In one embodiment, the inertial mass element may have a "T" shape, or any suitable shape for stability.

According to a second embodiment of the present invention, the linear resonant actuator may further include (a) a second EMP actuator; (b) a second substrate having a first surface and a second surface, the second EMP actuator being mounted on the first surface of the second substrate; and (c) second clamping structure provided on two sides of the second EMP actuator, so as to allow the second substrate to vibrate with the second EMP actuator, in response to an electrical stimulation of the second EMP actuator. In this second embodiment, the inertial mass element includes a second contact surface for attaching to the second substrate at the second surface of the second substrate. Preferably, the first EMP actuator and the second EMP actuator are actuated by control signals that are 180° of each other.

The present invention is better understood upon consideration of the detailed description below in conjunction with the accompanying drawings.

DETAILED DESCRIPTION OF THE PREFERRED EMBODIMENTS

The present invention provides electromechanical polymer-based (EMP-based) linear resonant actuators (LRA). EMP-based LRAs are disclosed, for example, in copending U.S. patent application ("Copending Patent Application I"), Ser. No. 13/917,501, entitled "Ultra-thin Inertial Actuator," filed on Jun. 13, 2013. The disclosure of Copending Patent Application I is hereby incorporated by reference in its entirety.

Figure 1:
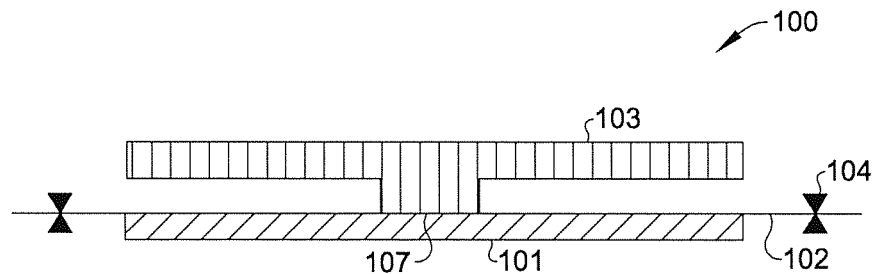
FIG. 1 shows, in cross section, generalized linear resonant actuator 100, in accordance with one embodiment of the present invention.

FIG. 1 shows generalized linear resonant actuator (LRA) 100, in accordance with one embodiment of the present invention. As shown in FIG. 1, LRA 100 includes electromechanical polymer (EMP) actuator 101, which is mounted on flexible substrate 102. Description of suitable EMP actuators for this application may be found, for example, in copending U.S. patent application ("Copending Patent Application II"), Ser. No. 13/683,963, entitled "Localized Multimodal Electromechanical Polymer Transducers," filed on Nov. 21, 2012. The disclosure of the Copending Patent Application II is hereby incorporated by reference in its entirety. In this embodiment, substrate 102 may be a stainless steel metal strip (e.g., stainless steel strip) or a plastic strip. Although shown in FIG. 1 to be much thinner than EMP actuator 101, substrate 102 may actually be thicker or comparable to EMP actuator 101, which may be, for example, 0.1 mm thick. Substrate 102 may be held in position by clamping structures 104 on both sides of EMP actuator 101 and is allowed to vibrate freely between the clamping structures. In FIG. 1, inertia mass 103 is attached on the side of substrate 102 that is opposite to the side on which EMP actuator 101 is mounted.

Figure 2:
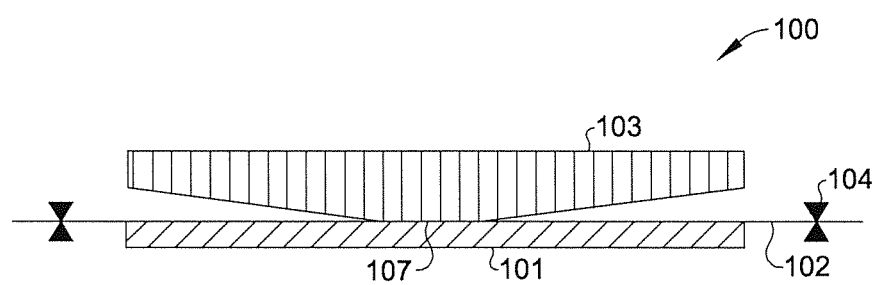
FIG. 2 shows, in cross section, generalized linear resonant actuator 100, in which inertial mass 103 is provided a different shape that is shown in FIG. 1, in accordance with one embodiment of the present invention.

Inertia mass 103 can be provided in any of numerous shapes. As shown in FIG. 1, inertial mass 103 has a "T" shape in cross section. Alternatively, inertial mass 103 may also have the trapezoidal shape in cross section, as illustrated in FIG. 2. As shown in FIG. 2, as in the "T" shape illustrated in FIG. 1, inertial mass 103 includes relatively small flat contact surface 107 that contacts substrate 102. Significantly, inertial mass 103 is attached to substrate 102 in such a manner that, while designed to affect the resonant amplitude and frequency in the vibration of substrate 102, inertial mass 103 does not otherwise limit the motion of substrate 102. To achieve even better vibrations, the contact surface of inertial mass 103 is preferably diminished. Inertial mass 103 may include metal, or other suitable materials (e.g., polymers or dielectrics). For example, inertial mass 103 may have a mass between 0.5 g-10 g, such as 1 g-5 g.

Figure 3:
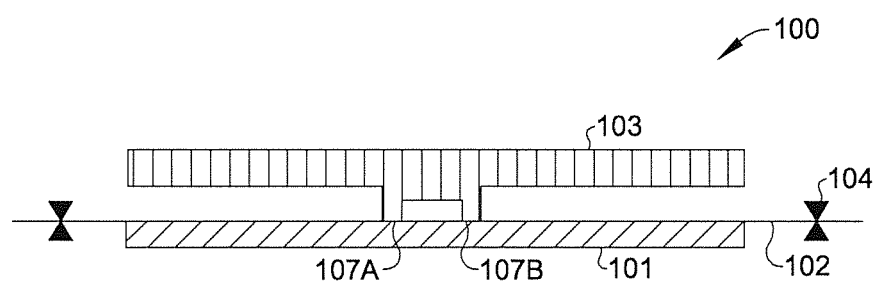
FIG. 3 shows, in cross section, an alternative implementation of LRA 100, in which inertial mass 103 is provided reduced contact surface areas 107a and 107b that are collectively smaller than contact surface area 107 of the implementation of LRA 100 shown in FIG. 1, in accordance with one embodiment of the present invention.
Figure 4:
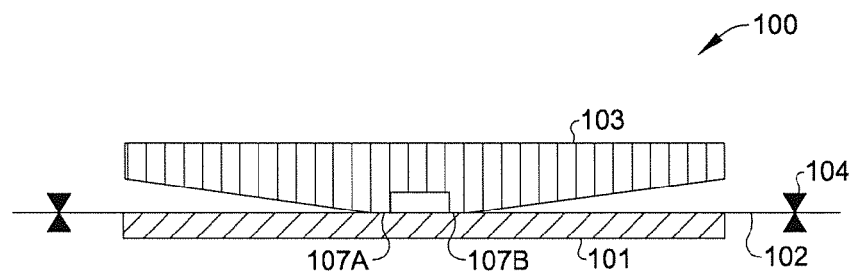
FIG. 4 shows, in cross section, an alternative implementation of LRA 100, in which inertial mass 103 is provided reduced contact surface areas 107a and 107b that are collectively smaller than contact surface area 107 of the implementation of LRA 100 shown in FIG. 2, in accordance with one embodiment of the present invention.

FIGS. 3 and 4 show, respectively, alternative implementations of LRA 100, in which inertial mass 103 is provided contact surface areas 107a and 107b that are even smaller than surface areas 107 of the implementations of LRA 100 shown in FIGS. 1 and 2. Ideally, inertial mass 103 of FIGS. 3 and 4 contact substrate 102 along parallel narrow lines or strips 107a and 107b, each running perpendicular to the cross section. Alternatively, contact surface areas 107a and 107b may be provided by semi-cylindrical projections from inertial mass 103. The smaller contact areas reduce the constraints on the vibration, but at the same time maintain stability to inertial mass 103. In some embodiments, when LRA 100 is used in an electronic device, rather than expressly providing an inertial mass, EMP 101 actuator may be attached to a movable component of the electronic device (e.g., a button or a display component), which serves the function of inertial mass 103.

Figure 5:
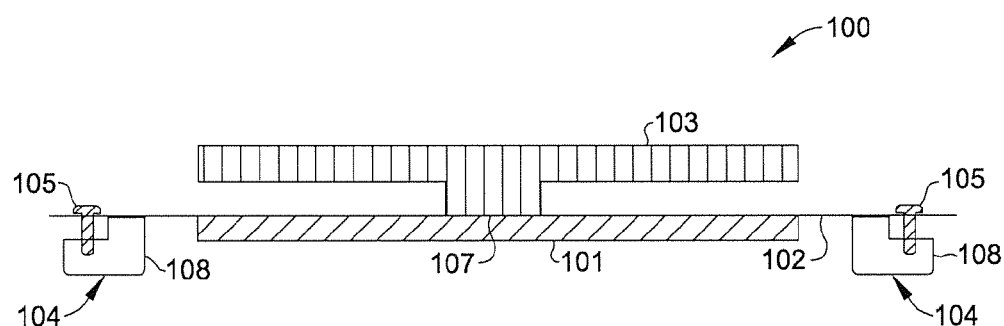
FIG. 5 shows an alternative implementation of LRA 100, in which clamping structure 104 includes screw 105 to secure substrate 102, according to one embodiment of the present invention.

FIG. 5 shows an alternative implementation of LRA 100, in which clamping structures 104 includes screws 105 to secure substrate 102, according to one embodiment of the present invention. Clamping structure 104 may include anchor element 108 on each side of substrate 102. Each combination of anchor element 108 and screw 105 in clamping structure 104 allows tension to be applied to substrate 102. For example, as shown in FIG. 5, anchor elements 108 each provide a contact surface to substrate 102. As each of screws 105 is turned, substrate 102 is pulled at the corresponding contact surface of substrate 102, thereby resulting in a corresponding tension along the surface of substrate 102. The weight of inertial mass 103 and the tension in substrate 102 are parameters that determine the resonant frequency of LRA 100.

Figure 6:
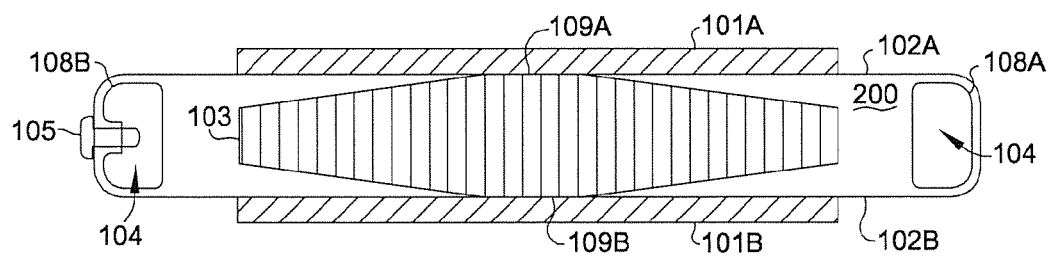
FIG. 6 shows EMP-based LRA 200, according to one embodiment of the present invention.

FIG. 6 shows EMP-based LRA 200, according to one embodiment of the present invention. Unlike LRA 100 of FIGS. 1-5, LRA 200 includes EMP actuators 101a and 101b mounted on substrates 102a and 102b, respectively. (Substrates 102a and 102b may be provided from a single sheet of flexible material, such as shown in FIG. 6). As shown in FIG. 6, inertial mass 103 has two surfaces 109a and 109b which are respectively attached to substrates 102a and 102b. Preferably, EMP actuators 101a and 101b are actuated or driven by control signals that are 180° out of phase, so as to create a maximally reinforcing vibration. In FIG. 6, clamping structure 104 includes single screw 105 on anchor element 108b and stationary anchor element 108a on the other side, so that tension adjustments in substrates 102a and 102b may be made simultaneously. Each of anchor elements 108a and 108b provides contact surfaces on both substrates 102a and 102b. As screw 105 is turned, substrates 102a and 102b are both pulled in the direction away from anchor 108a, thereby increasing the tensions in both substrates 102a and 102b. As shown in FIG. 6, inertial mass 103 has, in cross section, the shape of two trapezoids placed on top of each other in mirrored orientations. Alternatively, inertial mass 103 may have a shape (in cross section) of two "Ts" placed in mirrored orientations on top of each other.

In conventional dielectric elastomers, a high voltage (e.g., in kilovolts) is required to create an appreciable vibration. Such a high voltage is hazardous and typically requires expensive special circuit isolation not readily available to handheld consumer electronic devices. In comparison, much lower voltages, such as voltages below 200V, may be used with an inertial actuator of the present invention.

An EMP layer in an EMP actuator of the present invention, in film form, may be selected from any of: $P(VDF_x\text{-}TrFE_y\text{-}CFEI_{x-y})$, $P(VDF_x\text{-}TrFE_y\text{-}CTFEi_{x-y})$, poly(vinylidene fluoride-trifluoroethylenevinylidede chloride) (P(VDF-TrFE-VC)), poly(vinylidene fluoride-tetrafluoroethylenechlorotrifluoroethylene) (P(VDF-TFE-CTFE)), poly(vinylidene fluoride-trifluoroethylenehexafluoropropylene), poly(vinylidene fluoride-tetrafluoroethylene-hexafluoropropylene), poly(vinylidene fluoride-trifluoroethylene-tetrafluoroethylene), poly(vinylidene fluoridetetrafluoroethylene-tetrafluoroethylene), poly(vinylidene fluoride-tri fluoroethylene-vinyl fluoride), poly(vinylidene fluoride-tetrafluoroethylene-vinyl fluoride), poly(vinylidene fluoridetrifluoroethylene-perfluoro(methyl vinyl ether)), poly(vinylidene fluoride-tetrafluoroethylene-perfluoro(methyl vinyl ether)), poly(vinylidene fluoride-trifluoro ethylene-bromotrifluoroethylene, polyvinylidene), poly(vinylidene fluoride-tetrafluoroethylenechlorofluoroethylene), poly(vinylidene fluoride-trifluoroethylene-vinylidene chloride), and poly(vinylidene fluoride-tetrafluoroethylene vinylidene chloride), or in a general form of $P(VDF_x\text{-}2nd\ monomer_y\text{-}3rd\ monomer_{1-x-y})$, where x may range from 0.5 to 0.75, and y may range from 0.45 to 0.2. Suitable polymers are also described in U.S. Pat. No. 6,787,238.

A suitable EMP layer can also be selected from high energy electron irradiated $P(VDF_x\text{-}TrFE_{1-x})$ copolymers, where x varies from 0.5 to 0.75 (See, e.g., U.S. Pat. Nos. 6,423,412 and 6,605,246 for representative copolymers and compositions). A suitable EMP can be selected from the copolymer of $P(VDF_{1-x}\text{-}CTFE_x)$ or $P(VDF_{1-x}\text{-}HFP_x)$ where x ranges from 0.03 to 0.15 in moles. A suitable EMP can be a blend of one or more terpolymers with one or more other polymers. The EMP film can be uniaxially stretched and in fabricating the EMP actuator, the uniaxial stretching direction may be along the displacement direction of the actuator. The EMP films can be in a non-stretched form or biaxially stretched.

An EMP layer for an EMP actuator of the present invention may include semi-crystalline electromechanical polymer-based actuator materials (e.g., modified P(VDF-TrFE)), which provide remarkably improved performance for high definition haptics in handheld consumer devices. The EMP actuators of the present invention are shock-tolerant, require modest voltages consistent with requirements in OEM products, and are capable of high definition responses. Such an electro-active material can exhibit significant electrostriction (e.g., an electric field-induced strain 7%, a 70 times increase over the conventional piezo-ceramics and piezo-polymers). Furthermore, this class of polymers also possesses a high force capability, as measured by the high elastic energy density of 1 J/cm3. Suitable EMPs in this class include high energy density irradiated poly(vinylidene fluoride-trifluoroethylene) (P(VDF-TrFE), as described in U.S. Pat. Nos. 6,423,412 and 6,605,246), P(VDFTrFE)-based terpolymers, such as poly(VDF-TrFE-chlorotrifluoroethylene), (P(VDF-TrFECTFE)), poly(vinylidene fluoride-trifluoroethylenechlorofluoroethylene), (P(VDF-TrFE-CFE)), and the like. U.S. Pat. No. 6,787,238). The disclosures in patent applications referred to in this application are incorporated herein by reference. The EMP layer may also be a relaxor ferroelectric polymer. A relaxor ferroelectric polymer may be a polymer, copolymer, or terpolymer of vinylidene fluoride. Examples include P(VDF-TrFE-CFE) or P(VDF-TrFE-CTFE) terpolymer, a high energy irradiated $P(VDF_x\text{-}TrFE1\text{-}x)$ copolymer, where x is between 0.5 and 0.75 inclusive, P(VDF1-x-CTFEx) or P(VDF1-x-HFPx) where x is in the range from 0.03 to 0.15 molar, polymer blends such as blends of P(VDF-CTFE) with P(VDF-TrFE-CFE) or P(VDF-TrFE-CTFE), where the content of P(VDF-CTFE) is between 1% and 10% by weight.

The detailed description above is provided to illustrate specific embodiments of the present invention and is not intended to limiting. Numerous modifications and variations within the scope of the present invention are possible. The present invention is set forth in the accompanying claims.

I claim:

1. A linear resonant actuator, comprising:
   an electromechanical polymer (EMP) actuator;
   a substrate having a first surface and a second surface, the EMP actuator being mounted on the first surface of the substrate;
   clamping structure provided on the substrate on two sides of the EMP actuator so as to allow the substrate to vibrate with the EMP actuator, in response to an electrical stimulation of the EMP actuator; and
   an inertial mass element having a contact surface for attaching to the substrate at the second surface of the substrate.

2. The linear resonant actuator of claim 1, wherein the inertial mass element include contact structures provided to attach to the substrate along thin parallel lines.

3. The linear resonant actuator of claim 1, wherein the clamping structure comprises a screw attached to an anchor element in contact with the substrate, so as to allow adjustment of tension in the substrate by the screw.

4. The linear resonant actuator of claim 1, wherein the inertial mass element has a "T" shape in cross section.

5. The linear resonant actuator of claim 1, wherein the inertial mass element has a trapezoidal shape in cross section.

6. The linear resonant actuator of claim 1, further comprising:
   a second EMP actuator;
   a second substrate having a first surface and a second surface, the second EMP actuator being mounted on the first surface of the second substrate;
   second clamping structure provided on the substrate on two sides of the second EMP actuator, so as to allow the second substrate to vibrate with the second EMP actuator, in response to an electrical stimulation of the second EMP actuator, wherein the inertial mass element includes second contact structures for attaching the second substrate at the second surface of the second substrate.

7. The linear resonant actuator of claim 5, wherein the EMP actuator and the second EMP actuator are actuated by control signals that are 180° of each other.

8. The linear resonant actuator of claim 5, wherein the inertial mass element has a shape, in cross section, of two "Ts" placed on top of each other in mirrored orientations.

9. The linear resonant actuator of claim 5, wherein the inertial mass element has a shape, in cross section, of two "Ts" placed on top of each other in mirrored orientations.

10. The linear resonant actuator of claim 5 wherein the clamping structure and the second clamping structure form a non-adjusting anchor element on one side common to both the EMP actuator and the second EMP actuator, and an adjusting anchor element on the other side common to both the EMP actuator and the second EMP actuator, the adjusting anchor element allows tension adjustment in both the substrate and the second substrate by turning a screw.

11. The linear resonant actuator of claim 1, wherein the EMP actuator comprises an EMP layer that includes a relaxor ferroelectric polymer.

12. The linear resonant actuator of claim 1, wherein the relaxor ferroelectric polymer comprises a polymer, copolymer, or terpolymer of vinylidene fluoride.

13. The linear resonant actuator of claim 1, wherein the EMP actuator comprises an EMP layer that includes a polymer selected from a group of polymers consisting of:
   $P(VDF_x\text{-}TrFE_y\text{-}CFE_{1-x-y})$ (CFE: chlorofluoroethylene), $P(VDF_x\text{-}TrFE_y\text{-}CTFE_{1-x-y})$ (CTFE: chlorotrifluoroethylene), Poly(vinylidene fluoride-trifluoroethylenevinylidede chloride) (P(VDF-TrFE-VC)), poly(vinylidene fluoride-tetrafluoroethylenechlorotrifluoroethylene) (P(VDF-TFE-CTFE)), poly(vinylidene fluoride-trifluoroethylene-hexafluoropropylene), poly(vinylidene fluoride-tetrafluoroethylene-hexafluoropropylene), poly(vinylidene fluoridetrifluoroethylene-tetrafluoroethylene), poly(vinylidene fluoride-tetrafluoroethylenetetrafluoroethylene), poly(vinylidene fluoride-tri fluoroethylene-vinyl fluoride), poly(vinylidene fluoride-tetrafluoroethylene-vinyl fluoride), poly(vinylidene fluoride-trifluoroethyleneperfluoro(methyl vinyl ether)), poly(vinylidene fluoride-tetrafluoroethyleneperfluoro (methyl vinyl ether)), poly(vinylidene fluoride-trifluoroethylene-bromotrifluoroethylene, polyvinylidene), poly(vinylidene fluoride-tetrafluoroethylene-chlorofluoroethylene), poly (vinylidene fluoride-trifluoroethylene-vinylidene chloride), and poly(vinylidene fluoride-tetrafluoroethylene vinylidene chloride), where x ranges between 0.5 and 0.75 and y ranges between 0.45 and 0.2.

14. The linear resonant actuator of claim 1, wherein the EMP actuator comprises an EMP layer that includes a P(VDF-TrFE-CFE) or P(VDF-TrFE-CTFE) terpolymer.

15. The linear resonant actuator of claim 1, wherein the EMP actuator comprises an EMP that includes a high energy irradiated $P(VDF_x\text{-}TrFE_{1-x})$ copolymer, where x is between 0.5 and 0.75 inclusive.

16. The linear resonant actuator of claim 1, wherein the EMP actuator comprises an EMP layer that includes $P(VDF_{1-x}\text{-}CTFE_x)$ or $P(VDF_{1-x}\text{-}HFP_x)$ where x is in the range from 0.03 to 0.15 molar.

17. The linear resonant actuator of claim 1, wherein the EMP actuator comprises an EMP layer that includes a blend of P(VDF-CTFE) with P(VDF-TrFE-CFE) or P(VDF-TrFE-CTFE), where the content of P(VDF-CTFE) is in the range of 1% to 10% by weight.

* * * * *